United States Patent [19]

Chen et al.

[11] Patent Number: 6,063,647
[45] Date of Patent: May 16, 2000

[54] METHOD FOR MAKING CIRCUIT ELEMENTS FOR A Z-AXIS INTERCONNECT

[75] Inventors: Yu Chen; Joel A. Gerber, both of St. Paul; Brian E. Schreiber, Oakdale, all of Minn.; Joshua W. Smith, Corvallis, Oreg.

[73] Assignee: 3M Innovative Properties Company, Saint Paul, Minn.

[21] Appl. No.: 08/986,882

[22] Filed: Dec. 8, 1997

[51] Int. Cl.[7] .............................. H01L 21/44; H01L 21/48; H01L 21/50
[52] U.S. Cl. .............................. 438/108; 438/613
[58] Field of Search ..................... 438/108, 613

[56] References Cited

U.S. PATENT DOCUMENTS

| | | | |
|---|---|---|---|
| 3,913,223 | 10/1975 | Gigoux | 29/625 |
| 4,749,120 | 6/1988 | Hatada | 228/123 |
| 5,282,312 | 2/1994 | DiStefano et al. | 29/830 |
| 5,401,913 | 3/1995 | Gerber et al. | 174/264 |
| 5,502,884 | 4/1996 | Ladouceur | 29/407.05 |
| 5,808,360 | 9/1998 | Akram . | |
| 5,897,336 | 4/1999 | Brouillette et al. . | |

FOREIGN PATENT DOCUMENTS

| | | | |
|---|---|---|---|
| 0 459 665 A1 | 5/1991 | European Pat. Off. | H05K 3/46 |
| 01164041 | 6/1989 | Japan . | |
| 06260772 | 9/1994 | Japan | H05K 3/46 |

*Primary Examiner*—John F. Niebling
*Assistant Examiner*—Josetta Jones
*Attorney, Agent, or Firm*—Matthew B. McNutt

[57] ABSTRACT

Methods for producing circuit elements the resultant circuit elements, and methods for making circuits therefrom are disclosed. A precursor circuit element includes a first insulating layer with conductor thereon and an electrically conducting member or bump, protruding from the conductor, that provide a shape to one surface of the precursor circuit element. A second insulating layer, including an adhesive, is placed onto the precursor circuit element and assumes the shape of the aforementioned surface of the precursor circuit element. A portion of the insulating layer is removed proximate the apex of the bump to expose at least a portion of the bump, for a sufficient electrical connection with a subsequent circuit element, while maintaining a sufficient amount of the insulating layer on the first initiating layer and bump to facilitate the mechanical connection (bond) between this resultant circuit element and a second circuit element, that may or may not have been produced by the method of the present invention.

20 Claims, 10 Drawing Sheets

SORTING DISTRIBUTION OF
MEASURED VIAS RESISTANCE

METHOD FOR MAKING CIRCUIT ELEMENTS FOR A Z-AXIS INTERCONNECT

FIELD OF THE INVENTION

The present invention relates to circuits used in electronic packages. In particular, the invention relates to methods for preparing circuit elements that when bonded to other circuit elements form circuits with improved electrical and mechanical connections between adjacent circuit elements. The present invention additionally relates to circuits formed from the circuit elements prepared by the methods of the present invention.

BACKGROUND OF THE INVENTION

Contemporary electronic devices require multiple circuit elements including, for example, integrated circuits, flexible circuits, single and multi-layer circuit boards, chip scale packages and ball grid array packages. These circuit elements must be connected by multiple precise mechanical and electrical connections in order for the devices to function reliably. Numerous approaches have been made to make reliable electrical connections in a low cost and efficient manner. These approaches have met with varying degrees of success.

One basic approach involves plated through hole (PTH) printed wiring board fabrication processes, for making the mechanical and electrical connections in separate processing steps. A typical mechanical connection between printed circuit boards is made by placing a sheet of adhesive resin impregnated fiber mat between two double sided printed circuit boards to form an assembly. This assembly is then placed in a lamination press and bonded under heat and pressure, mechanically connecting the boards.

Electrical connection then occurs in a separate series of steps, commonly known as a plated through hole (PTH) process. This PTH process typically includes drilling holes in the circuit board where electrical contact between layers is desired, to create a via. These vias include walls that are cleaned and plated with conductive metallurgy.

However, this conventional PTH fabrication has several drawbacks. There are yield losses and reliability issues associated with the multiple step processing in PTH technology, resulting in increased costs as circuit feature size is reduced.

Processes that form the mechanical and electrical connections simultaneously potentially simplify the manufacturing process and reduce costs associated therewith. One method of simultaneously forming mechanical and electrical connections employs an adhesive ply with conductive buttons to attach circuit elements. For example, U.S. Pat. No. 5,282,312 (DiStefano et al.) discloses two metal flexible circuits patterned with PTH vias. The connection between circuit layers is made by an adhesive bond ply with patterned conductive buttons. The buttons are placed in the bond ply at locations where connections are desired between the circuit layers. The adhesive bond ply has sufficient rigidity such that conduction through the bond ply is only permitted at conductive buttons. One drawback to this construction is the required complex patterning process and subsequent registration of the bond ply to the circuit layers, that adds cost and decreases yield.

Another approach to making circuit element connections, such as those between chips and boards, flexible circuits to boards and other related circuit structures, and also to form inter-layer connections in circuit boards, involves making the mechanical and electrical connections simultaneously in one press step or a series of steps. An example of this approach involves using anisotropic or z-axis adhesives, a recently developed class of conductive adhesives, to replace solder for surface mounting. These anisotropic adhesives include adhesive films loaded with conductive particles at a much lower volume fraction than conventional isotropically conductive adhesives.

In operation, when pressed between conductors of circuit elements, the anisotropic adhesive film is compressed, such that the adhesive is forced out of the way of the conductors, while the conductive particles remain trapped between the conductors, forming electrical contacts therebetween. It is important for these anisotropic adhesive films to have a conductive particle loading that is sufficiently disperse to prevent particle shorting in the plane of the circuit.

U.S. Pat. No. 5,502,884 (Casson et al.) discloses a method for fabricating a multilayer circuit board, that uses an anisotropically conducting adhesive to connect multiple layers of double sided circuitry. However, the resultant circuit has drawbacks, in that the use of a random dispersion of particles can not provide the high density of hole (or via) interconnections required for high performance circuits due to the possible electrical shorting between contacts. In addition, the random dispersion of particles requires patterned masking of the circuit layers to prevent shorting between layers.

Circuit elements have also been connected with nonconducting adhesives, by using patterned bumps on the circuit elements. For example, U.S. Pat. No. 4,749,120 (Hatada) describes a mechanical connection between a semiconductor device having an array of conducting bumps and corresponding pads on a wiring board, with a nonconducting adhesive. During the bonding process, the bumps are forced through the adhesive, making electrical contact with their respective pads.

U.S. Pat. No. 5,401,913 (Gerber et al.) discloses multiple circuit layers having columns (bumps) of a metal. The circuit layers are mechanically connected by a nonconducting adhesive layer placed between each successive circuit layer.

The circuit layers are subsequently laminated in the presence of heat and pressure, such that the bumps are forced through the adhesive layer and contact their respective pads on the adjacent circuit layer.

For many of the above described interconnection techniques, it is requisite that the respective conducting particles or bumps penetrate the adhesive layer, in order to form an electrical connection between conductive members of the circuit elements. This requirement puts significant constraints on the selection of adhesives. For example, insufficient flow can result in trapping small amounts of adhesive between the conducting elements, resulting in high resistance bonds and/or environmentally unstable bonds. Alternately, too much flow of the adhesive typically results in adhesive deposits in undesired locations on the circuit elements or resultant circuit as well as bond line nonuniformity, detrimental to electrical performance. Excess adhesive flow can also starve regions in the bond of adhesive, resulting in voiding or regions of very thin bond lines, leading to reduced adhesion and poor environmental performance.

SUMMARY OF THE INVENTION

The present invention advances the art by providing methods for mass producing circuit elements having adhesive in single or multiple layers, and substantially uniform conducting bumps, for making Z-axis electrical connections between multiple circuit elements, two or more of these elements being joined to form multi-layered circuits. In accordance with the principles of the present invention, such circuit elements can be economically mass produced by providing a substrate having a plurality of conductive bumps, covering the substrate and the conductive bumps with an insulating layer including adhesive, and selectively removing a portion of the insulating layer to expose at least the apexes of the bumps. After the portion of the insulating layer has been removed, it is significant that a sufficient amount of the insulating layer remains on the substrate for facilitating mechanical connections between the circuit element and a second circuit element. The resultant circuit element produced in accordance with the present invention, upon its being joined to a corresponding circuit element or layer, provides for highly reliable electrical connections of good electrical conductivity between bumps and their corresponding pads.

The present invention teaches a method for making electronic circuit elements that includes the steps of initially providing a precursor element with a first insulating layer and a first conductor attached to said first insulating layer. The first insulating layer has a first surface, at least a portion of which defines a first surface plane. The precursor element has a surface including the first surface of the insulating layer. An electrically conducting member, or bump, is then placed onto the precursor circuit element into electrical communication with the first conductor. The bump extends such that its apex is beyond the first surface plane. Additionally, the precursor element surface and the conducting member surface define a major surface of a predetermined shape. A second insulating layer is then placed (e.g., by standard deposition techniques) onto substantially all of the major surface. This second insulating layer includes oppositely disposed portions extending laterally from the bump, these oppositely disposed portions extend to points below the apex, of the bump or electrically conducting member. At least a portion of the second insulating layer proximate the apex of the bump or electrically conducting member is subsequently removed.

This now completed circuit element may be aligned with a correspondingly configured circuit element or circuit layer. The circuit element and correspondingly configured circuit element or circuit layer are brought together and joined, such that electrical connections between their conducting components have been made. This process can be used as desired on as many circuit elements and/or circuit layers as necessary to produce the desired multi-layered circuit.

BRIEF DESCRIPTION OF THE DRAWINGS

The present invention will be described with reference to the accompanying drawings, wherein like reference numerals identify corresponding or like components.

In the Drawings:

FIG. 2 is a top view of the precursor circuit element of FIG. 1a;

DETAILED DESCRIPTION OF THE DRAWINGS

The present invention, embodiments of which are described below and illustrated in the figures, relates generally to methods for preparing a circuit element and electrically interconnecting two or more circuit elements to form a multi-layered circuit. In the exemplary circuits described below, at least one circuit layer includes a circuit element prepared in accordance with the present invention.

As used throughout this application "circuit elements" refers generally to substrates of dielectric or other equivalent materials that support a circuit network having single or multiple layers of conductive traces, pads or other electrically conducting pathways. The dielectrics employed may be either rigid or flexible (non-rigid), and formed of single or multiple layers. Some typical circuit elements include flexible circuits, printed circuit boards, integrated circuits (packaged and unpackaged), including chips, dies and combinations thereof, and other similar components. These circuit elements, when combined with each other, similar components, or additional structures, form circuits, or multi-layered circuits.

In accordance with the present invention, only one or two electrical connections between two circuit elements are shown in FIGS. 1a–1d and 5a–5f, each circuit element having a single conductive circuit trace layer (but could also have multiple conductive circuit traces). These interconnections between two circuit elements are exemplary only, for purposes of illustrating the present invention, as the present invention typically involves multiple circuit elements of single or multiple circuit layers, with multiple conducting members (FIGS. 3a–3c), for multiple electrical connections between multiple adjacent circuit elements (and other similar structures) in order to form multi-layered circuits.

In FIGS. 1a–1d, there is detailed a first method for preparing a circuit element 20 (FIGS. 1c and 1d) that is joined with a second circuit element 21 to form a multi-layered circuit. The circuit element 20 is initially formed from a precursor circuit element 20p.

Figure 1A:
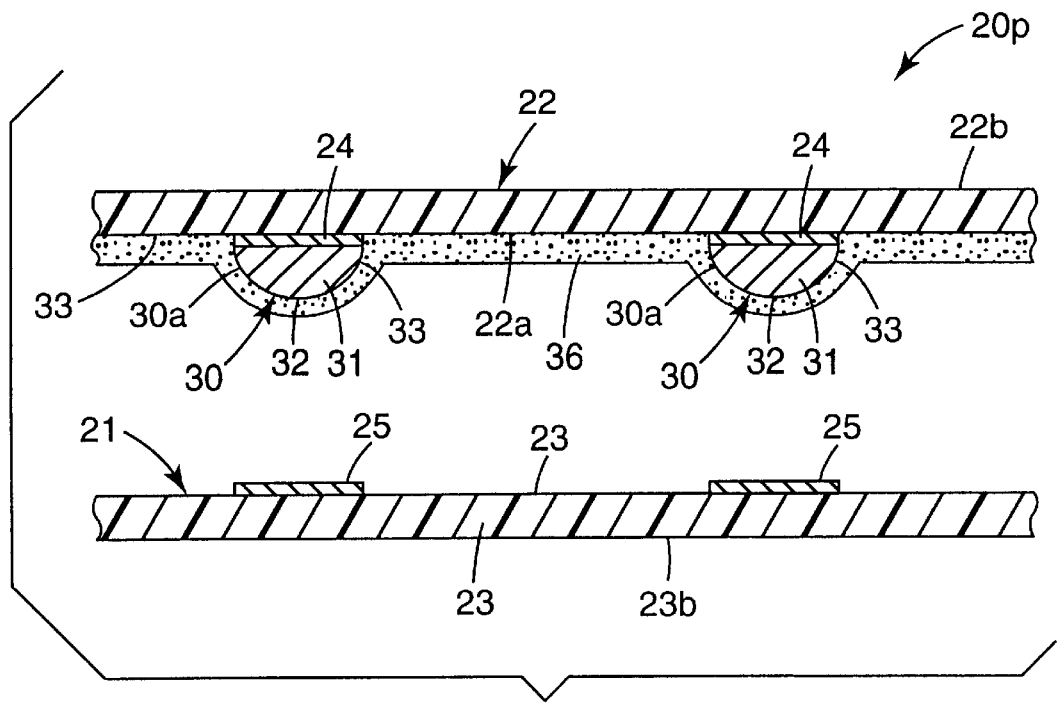
FIGS. 1a–1d are cross sectional views of a first method of the present invention.

Turning to FIG. 1a, the precursor circuit element 20p (that is ultimately processed into the first circuit elements 20, 20', 20"), and second circuit element 21 are typically formed of substrates 22, 23 of a dielectric, such as a polyimide foil. These substrates 22, 23 preferably have substantially planar surfaces 22a, 23a, and include single or multiple conductive circuit traces of an electrically conductive material such as copper or the like (not shown), in electrical communication with pads 24, 25 on the substrates 22, 23.

These pads 24, 25 may be portions of one or more of the conductive circuit traces, or may be separate conductive members of the circuit elements 20, 21 (or the precursor circuit element 20p) in electrical communication with one or more of the conductive circuit traces. The pads are typically of an electrically conductive material, such as copper or the like, that protrude from the respective surfaces 22a, 23a, and are placed onto the respective substrates 22, 23 at their surfaces 22a, 23a, by methods such as electrodeposition or vapor deposition.

Alternately, the pads 24, 25 could be placed into their respective substrates 22, 23, such that they are flush with their respective substrate surfaces 22a, 23a, or below the plane of their respective substrate surfaces 22a, 23a. Alternatively, for some circuit elements, such as chips in integrated circuits, there would be input/output pads that are generally recessed slightly with respect to a passivation layer on the substrate.

The precursor circuit element 20p includes electrically conducting members, preferably in the form of "bumps" 30, in electrical contact with at least one pad 24, although contact of a single bump with multiple pads is also permissible. These bumps 30 preferably have a substantially spherical-shaped portion 31 with a surface 30a, and protrude from the pads 24 to an apex 32 along the bump surface 30a. Other shapes, or portions thereof, such as rectangular, square, oval, triangular, pentagonal, polygonal, toroidal, annular ring, other ring-like shape, etc., and combinations thereof are also permissible for the bumps 30.

It is preferred that the height and shape of the bumps 30 be substantially uniform, to enable the bumps to make sufficient electrical contact(s), as described below. The surface 30a of the bumps 30, along with the substrate surface 22a, and the surfaces of the pads 24 not covered by the bumps 30, forms a structured or major surface 33 of the precursor circuit element 20p.

The bumps 30 are made of electrically conductive material(s), preferably as metals, but could also be electrically conductive adhesives, deposited onto the substrate surface 22a by conventional deposition techniques. Metals for the bump 30 include tin, aluminum, indium, lead, gold, silver, bismuth, copper, palladium, and the like and alloys of these metals. These metals forming the bump 30 also render it heat conductive, so the resultant circuit element can be used as a heat sink. For example, a circuit element of the present invention could be attached to a chip, to allow heat to be dissipated from the chip through the bumps 30.

The pads 25 on the second circuit element 21 are preferably located on the substrate 23 of the second circuit element 21 at positions corresponding to those of the bumps 30 on the precursor circuit element 20p, so that, when registered together as matched elements the bumps and pads will be centered on each other for good contact. In accordance with the present invention, the first circuit element 20 may also include pads on its substrate surface 22b opposite the substrate surface 22a having the bumps 30. Additionally, the second circuit element 21, may include bumps (in accordance with those described above) on pads on its substrate surface 23b, as well as bumps (in accordance with those described above) on the pads 25 (to be used in forming a bump-to-bump contact in the resultant circuit), to be part of a multi-layered circuit. The placement of these additional pads or bumps on the precursor circuit element 20p and second circuit element 21 (and additional circuit elements if desired) is dependent upon the number of circuit layers desired for the particular circuit being designed.

An insulating layer 36, preferably an adhesive, may include additional components known to those skilled in the art, such as, for example, inorganic fillers and the like. The layer 36 is placed on the precursor circuit element 20p by techniques such as, for example, solution coating, sheet laminating, or spraying.

Suitable adhesives include heat-flowable, thermosetting or thermoplastic adhesives, either alone or in combinations thereof. Examples of such adhesives include epoxies, cyanate esters, acrylates, phenolics, silicones, polyimides, polyamides and the like. These adhesives facilitate bonding between the circuit elements 20, 21 (FIG. 1d)

The insulating layer 36 is deposited onto the precursor circuit element 20p in substantial conformance with the topography of the major surface 33, such that the surfaces 36a of the insulating layer 36, extending laterally from the bumps 30, do not extend beyond the apex 32 of the bump 30. Preferably, the insulating layer 36 deposited onto the precursor circuit element 20p has a substantially uniform thickness. The deposited insulating layer 36 should conform to the topography of the major surface 33. Additionally, the surfaces 36a of the insulating layer 36 that extend laterally from the bumps 30 define a surface A (See FIG. 1b). FIG. 2 shows a plane view of the circuit element 20 from the bump 30 side.

Figure 1B:
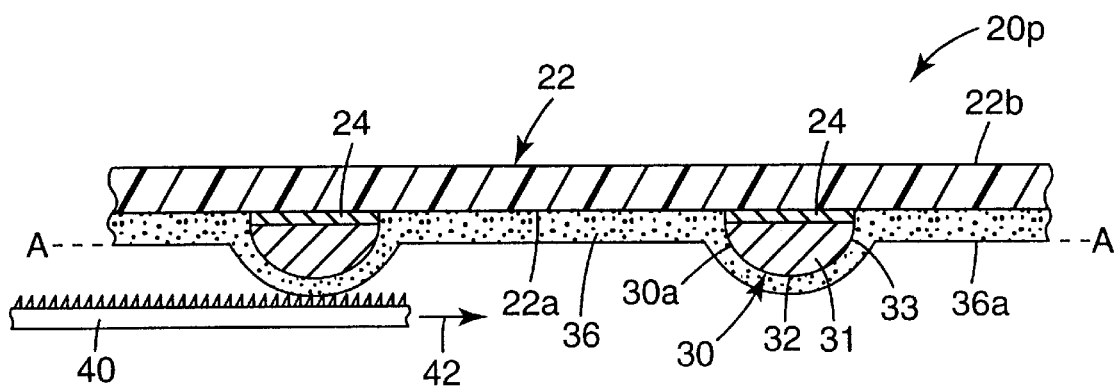
Figure 1C:
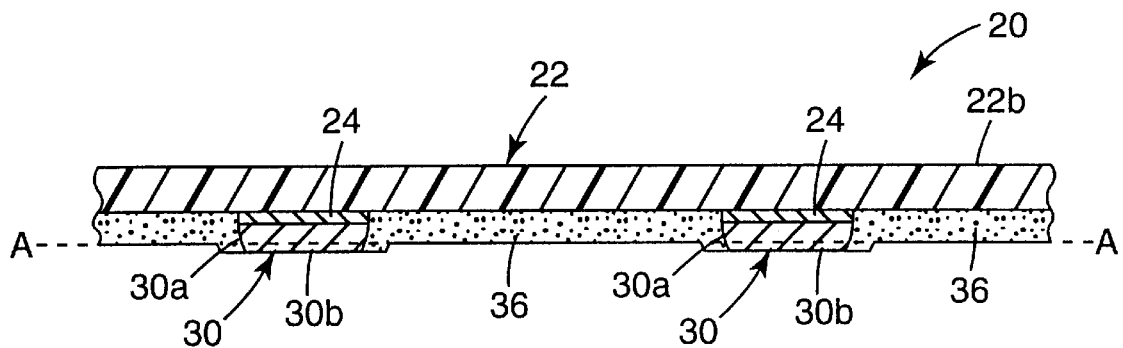
Figure 1D:
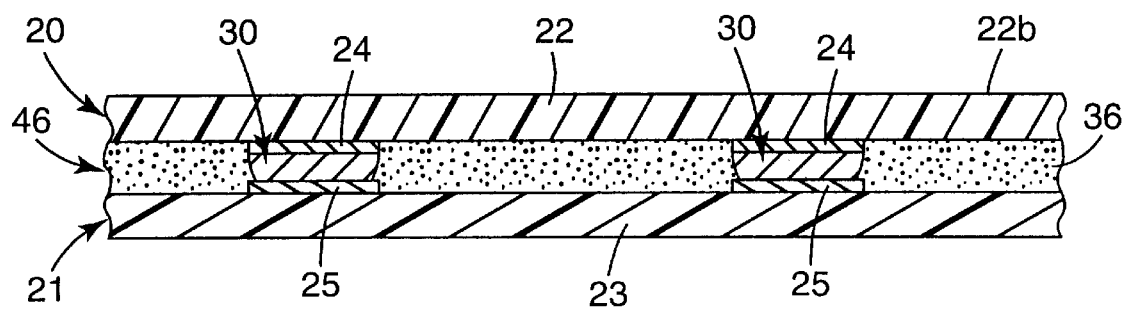
Figure 2:
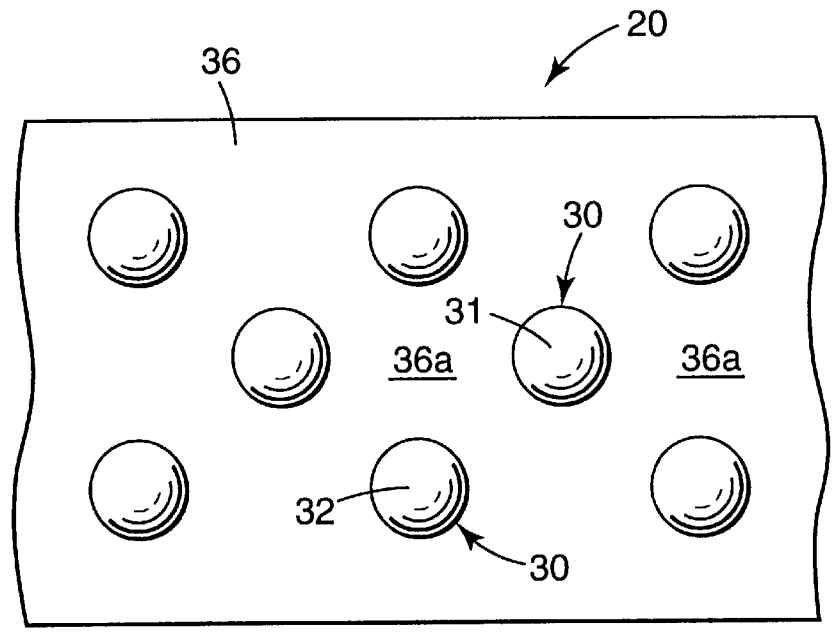

As shown in FIGS. 1b and 1c, the precursor circuit element 20p is further processed by removing at least a portion of the insulating layer 36. The layer 36 is preferably removed in the area between plane A and the apexes 32 of the bumps 30 to expose a portion of each bump 30. This removal of at least a portion of the insulating layer 36 may also involve removing a portion of each bump, with any removed portions of the bumps preferably limited to the area between plane A and the apexes 32 of the bumps 30. As a result of this preferred removal, portions of the bumps 30 remain covered with the insulating layer 36. The amount of the insulating layer 36 that is removed should be sufficient to expose the material of the bump 30 at the bump apex 32 (top), such that a sufficient electrical contact can be made between the bump 30 and its respective pad 25 (when the circuit elements 20, 21, are joined or laminated together, as shown in FIG. 1d and described below). A sufficient amount of the insulating layer 36 should remain to facilitate a sufficient mechanical connection or bond when the circuit elements 20, 21 (FIG. 1d), are joined or laminated together.

Preferably, removal of the insulating layer 36 (and portions of the bumps 30, if necessary) should be limited to the area proximate the apexes 32 of the bumps 30, at points substantially beyond plane A. Only small amounts of the insulating layer 36 should be removed during this process, so that a sufficient portion of the insulating layer 36, remains on the bump and substrate of the circuit element 20 (FIG. 1c) for facilitating a sufficient mechanical connection when the circuit elements 20,21 are joined (FIG. 1d).

A first method, as detailed in FIGS. 1b, for removing the insulating layer 36, to produce the (first) circuit element 20 (FIG. 1c) with at least a portion of the bumps 30 exposed, is by mechanical processes including abrasion (or cleaning). In this method, the portions of the insulating layer 36, extending beyond plane A (toward the apexes 32 of the bumps 30) are then contacted with an abrasive material 40, such as sand paper of approximately 120–1200 grit or other suitable abrasive materials, including microabrasives such as, for example, those available under the trade designation Imperial Lapping Film from 3M Co., St. Paul, Minn. The abrasive material should remove sufficient material of the insulating layer 36 and the bumps 30 to expose at least a portion of the material of the bumps 30. Preferably, abrasion should not extend further than plane A (toward the substrate 22), and should preferably be in an area proximate to the apexes 32 of the bumps 30. This way, the resultant circuit element 20, shown in FIG. 1c, has a newly exposed bump surface 30b, beyond plane A, and there remains a sufficient amount of material of the insulating layer 36 on the substrate 22 and the bump to facilitate the mechanical connection between the circuit elements 20, 21 (FIG. 1d). Preferably, a substantial portion of the insulating layer 36 remains intact, having been unaffected by this removal step.

The first abrasion removal method (with abrasive material 40) is preferred when bump height is non-uniform (although uniformity in bump height is preferred). By removing a portion of the bump 30, as occurs with this abrasion removal method, variations in bump height and shape can be corrected.

Figure 3A:
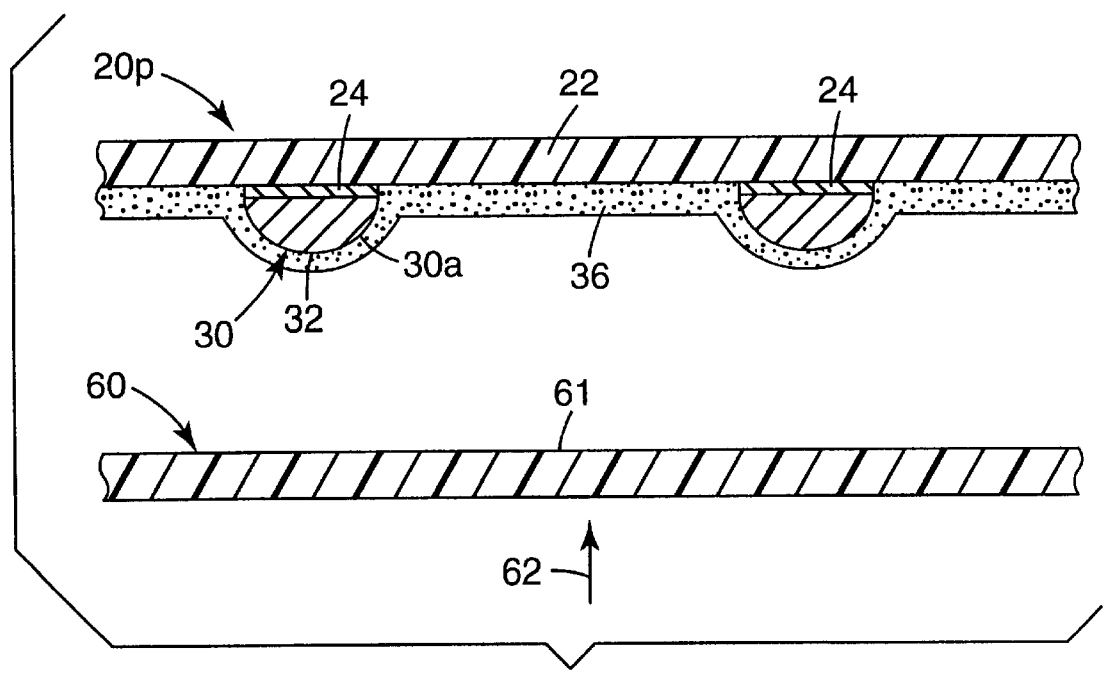
FIGS. 3a–3c and 4a–4c are cross sectional views of alternate insulating layer removal methods, shown in use with the method of FIGS. 1a–1d.
Figure 3B:
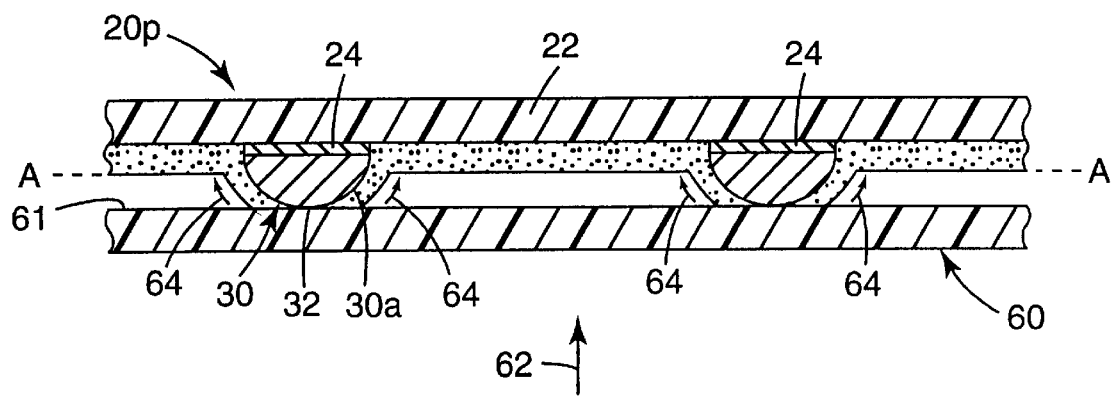
Figure 3C:
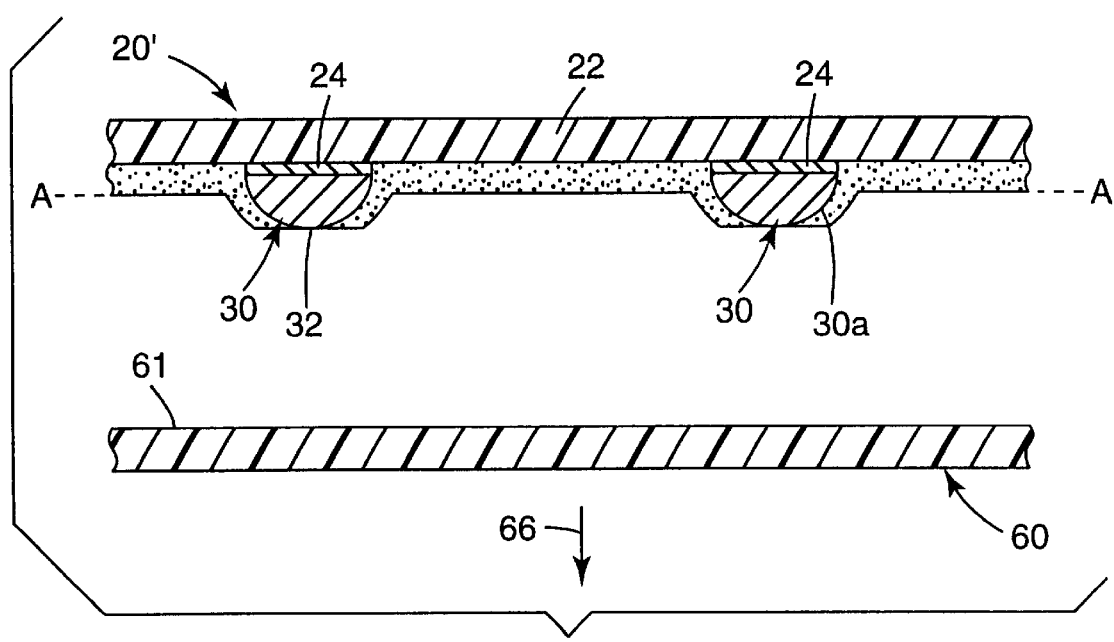

A second removal method, as an alternate to the abrasion method detailed above, is shown in FIGS. 3a–3c. This alternate method allows for removal of a sufficient portion of the insulating layer 36, to expose the material of the bumps 30, by bringing a smooth surfaced article 60 or smooth surfaced roller (not shown), with a substantially planar surface 61, into contact with the precursor circuit element 20p (in the direction of arrows 62), preferably beyond plane A (in a direction toward the apexes 32 of the bumps 30) (FIG. 3a). The article 60 and specifically, its surface 61 subsequently is pushed into contact with the insulating layer 36 on the precursor circuit element 20p toward the bumps 30. This pushing action (in the direction of the arrows 62), forces the adhesive of the insulating layer 36 away from the apexes 32 of the bumps 30 (in the direction of the arrows 64), by thinning and/or cracking the adhesive of the insulating layer 36, as shown specifically in FIG. 3b. In an optional step, heat may be applied to aid the flow of the adhesive of the insulating layer 36.

The planar surfaced article 60 does not adhere to the adhesive of the insulating layer 36. As shown in FIG. 3c, as the planar surfaced article 60 is removed from contact with the precursor circuit element 20p (in the direction of arrows 66), the resultant circuit element 20' has an exposed portion of the surface 30a of the bumps 30 (sufficient for a subsequent electrical connection), that is proximate the apexes 32 of the bumps 30. Additionally, sufficient amounts of the material (e.g., adhesive) insulating layer 36 remain on the substrate 22 and the bump 30 of the circuit element 20' to facilitate the mechanical connection between the circuit elements 20', 21. Preferably, a sufficient amount of the insulating layer 36 remains intact, having been unaffected by this removal step. The circuit element 20' is ready for further processing, in accordance with the methods as detailed below (as described below for circuit element 20).

Figure 4A:
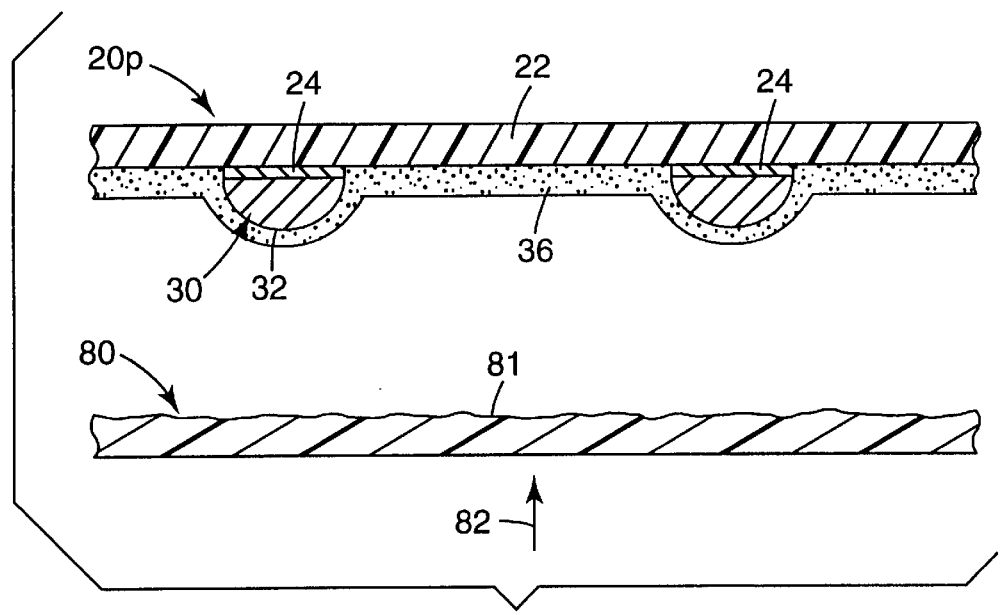
Figure 4B:
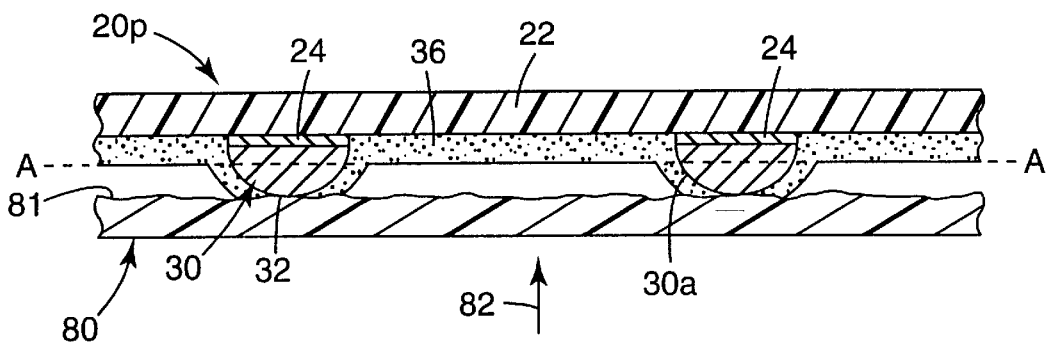
Figure 4C:
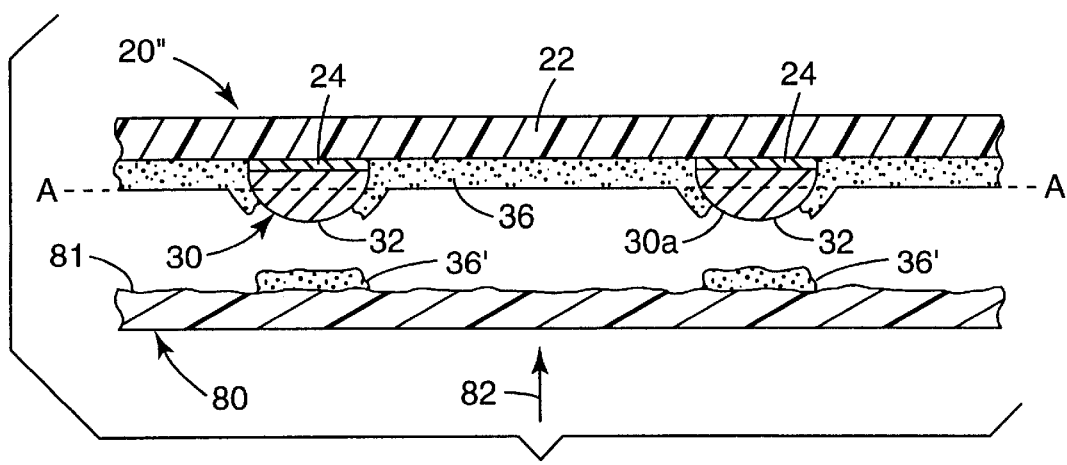

In another alternate removal method, shown in FIGS. 4a–4c, an article 80 with a surface 81 (exaggerated for illustration purposes) having an affinity for the material (e.g., adhesive) of the insulating layer 36, greater than the surfaces 30a of the bumps 30, is brought into contact with the precursor circuit element 20p (in the direction of the arrows 82) (FIG. 4a). It is preferred that the surface 81 be substantially planar and that this surface be rough or sticky. The article 80 is subsequently pushed into contact with the insulating layer 36 of the precursor circuit element 20p toward the bumps 30 (in the direction of the arrows 82), such that only the insulating layer 36, along the apexes 32 of the bumps 30 (preferably along an arc proximate the apex 32) beyond plane A, contacts the article surface 81 (FIG. 4b).

As shown in FIG. 4c, upon removal (separation) of the article 80 from the precursor circuit element 20p (now the circuit element 20")(in the direction of the arrows 84), the insulating layer portions 36', formerly on the precursor circuit element 20p, are now on the article surface 81. With the insulating layer portions 36' removed, the resultant circuit element 20" has a now-exposed bump surface 30a proximate the bump apexes 32. This exposed bump surface 30a is sufficient to promote an electrical connection between this circuit element 20" and another circuit element (e.g., circuit element 21), while substantial amounts of the insulating layer 36 remain on the substrate 22 and bump 30 to facilitate the mechanical connection between the above circuit elements. Preferably a sufficient amount of the remaining insulating layer 36 remains intact, having been unaffected by this removal step. Upon completion of the removal step, the circuit element 20" is ready for further processing, in accordance with the methods as detailed below (as described below for circuit element 20).

In another alternate step (not shown), the insulating layer 36 at the apexes 32 of the bumps 30 is thinned by first pushing the precursor circuit element 24 against a surface, such as the surface of a hot roller. This action pushes the material, e.g., adhesive, of the insulating layer 36 away from the apexes 32 of the respective bumps 30, such that the insulating layer 36 remaining on the apexes 32 of the bumps 30 is thinned substantially. This remaining thinned adhesive is removed by etching techniques, such as, for example, reactive ion etching, plasma etching, laser ablation, corona treatment and/or combinations thereof. The etching step is controlled to terminate when the thinned insulating layer 36 at the apexes 32 of the bumps 30 has been removed, while the bulk of the insulating layer 36 along the sides of the bumps 30 and the substrate 22 remains in an amount sufficient to facilitate the mechanical connection between the circuit elements.

Preferably, these areas of the insulating layer 36, remain intact, having been substantially unaffected by the etch process. The newly-prepared circuit element is ready for further processing in accordance with the methods detailed below (as described below for circuit element 20).

Once a sufficient portion of the bump 30 is exposed, by any of the above described removal methods, or combinations thereof, the now complete circuit element 20, 20', 20" may be joined with another circuit element, e.g., the second circuit element 21, for producing a multi-layered circuit. While only the joining of the circuit element 20 produced by abrasion, to a second circuit element 21, is detailed below, other circuit elements 20', 20" (and those not shown), produced by the alternate methods detailed above, could be joined to the second circuit element 21 in accordance with the method steps detailed below.

The now complete first circuit element 20, produced by abrasion method with the abrasive material 40 (above), results in bumps 30 with newly exposed surfaces 30b, as shown in FIG. 1c. This circuit element 20 is subsequently aligned with the second circuit element 21, and these circuit elements 20, 21 are brought together. Specifically, the bumps 30 are aligned with their corresponding pads 25 on the second circuit element 21. The alignment can be performed by any suitable conventional alignment technique, such as mechanical alignment using alignment pins, optical registration using fiducials and other methods known in the art.

The circuit elements 20, 21 are joined or laminated as pressure is applied to them, making simultaneous mechanical and electrical connections therebetween. An optional heating step, e.g., to assist in flowing or curing the adhesive of the insulating layer 36 (if a flowable adhesive is used), may be done at any time during the lamination process, for as long as desired. The circuit elements 20, 21 are now bonded together into an intermediate circuit 46 (multi-layered circuit), as shown in FIG. 1d. The adhesive of the insulating layer 36 provides the mechanical strength to the intermediate circuit 46 and the exposed bumps 30 are in physical contact with their respective corresponding pads 25, creating the electrical connection.

Turning now to FIGS. 5a–5f, there is detailed a second method for preparing a circuit element 120 (FIGS. 5d–5f), from a precursor circuit element 120p and joining it with a second circuit element 121 (FIGS. 5e and 5f) to form a circuit, in accordance with the methods described above. The precursor circuit element 120p (that is ultimately processed into the circuit element 120) and the circuit element 121 are formed of substrates 122, 123 comprised of materials such as polyimide films (as described above). The substrates 122, 123 preferably have surfaces 122a, 122b, 123a, 123b, with substantially planar surfaces 122b and 123a having pads 124, 125 protruding therefrom. The pads 124, 125 are of the materials, and are constructed and arranged with respect to the substrates 122, 123, in accordance with the arrangements described above. The pads 124, 125 are in electrical communication with single or multiple conductive circuit traces (not shown) and, similar to the pads 24, 25 above (see FIGS. 1a–1d), may be portions of one or more of the conductive circuit traces.

Figure 5A:
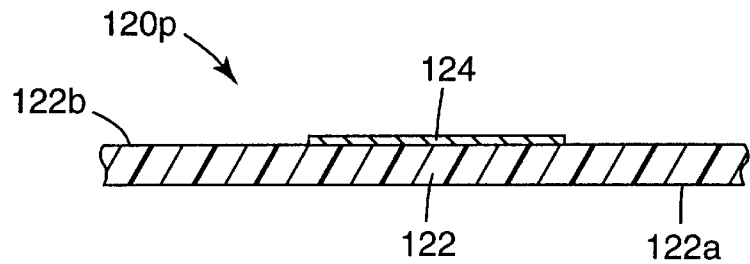
FIGS. 5a–5f are cross sectional views of a second method of the present invention.
Figure 5B:
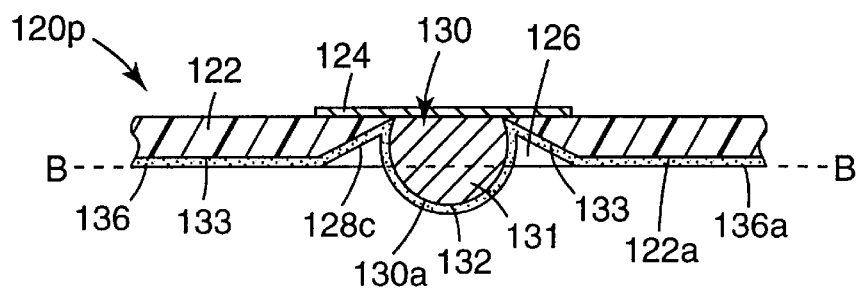

In FIG. 5b, a hole (via) 126, is then made in the substrate 122, of the precursor circuit element 120p, preferably by wet milling or dry milling techniques. Wet milling techniques may include, chemical etching and the like while dry milling techniques may include laser ablation, ion milling, reactive ion etching and the like. This hole 126 in the substrate 122 extends to the pad 124 and may be formed into any shape (round, square, rectangular, triangular, ovular, etc.). The walls 128 (having surfaces 128a) of the hole (via) 126, preferably extend outward from the pad 124.

Electrically conducting material, preferably in the form of bumps 130 (of the materials and of the shapes described above) is deposited, in accordance with the methods described above, into the vias 126. While only a single bump 130 is shown, the singular and plural of the term "bump" is used interchangeably throughout the description of these drawing figures, for as discussed above, the present invention involves multiple bumps (see FIG. 2 and the Examples below) in forming the multiple circuit interconnects. The bumps 130 could be arranged on the precursor circuit element 120p (circuit element 120) and second circuit element 121 in accordance with any of the arrangements detailed above.

These bumps 130 preferably have a substantially spherical-shaped portion 131 with a surface 130a, and protrude from the pads 124 to an apex 132 along the bump surface 130a. This 132 apex preferably extends to a point beyond a plane B (defined by the surfaces 136a of the insulating layer 136 extending laterally from the bumps 130), in order that portions of the insulating layer 136 or portions of the insulating layer 136 and the bump 130 can be removed at a point at or beyond, preferably beyond, plane B (detailed below and in FIG. 5c), to expose a portion of the bump 130 for subsequent electrical connection of the bump 130 of the circuit element 120, with a corresponding pad 125 on the opposite circuit element 121.

As detailed above, it is preferred that the height and shape of the bumps 130 be substantially uniform, to enable the bumps 130 to make sufficient electrical contact(s), as described below. The surface 130a of the bumps 130, along with the substrate surface 122a, the via wall surfaces 128a and the surfaces of the pads 124, not covered by the bumps 130, forms a structured or major surface 133 of the precursor circuit element 120p.

An insulating layer 136, in accordance with that described above, is deposited onto the precursor circuit element 120p, in accordance with the techniques described above, in substantial conformance with the topography of the major surface 133, such that the surfaces 136a of the insulating layer 136, extending laterally from the bumps 130, do not extend beyond the apex 132 of the bump 130. Preferably, the insulating layer 136 is deposited onto the precursor circuit element 120p, to be of a substantially uniform thickness, this deposition being such that the deposited insulating layer 136 takes a shape that conforms to the topography of the major surface 133.

Figure 5C:
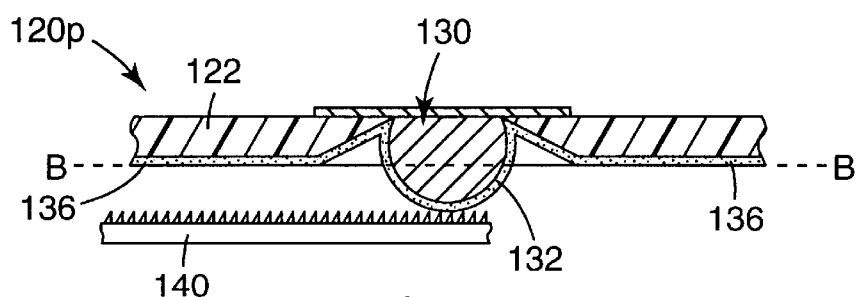

As shown in FIG. 5c, the precursor circuit element is further processed as a portion of the insulating layer 136 and a portion of the bump 130 are removed as an abrasive material 140, similar to that discussed above, is moved in the direction of the arrow 142 into contact with the insulating layer 136 and the bump 130, at a point beyond plane B, proximate the apex 132 of the bump 130, in accordance with the abrasion removal process detailed above (and shown in FIG. 1b).

Alternately, removal processes in accordance with the alternate (three) additional removal methods discussed above (two of the methods detailed in FIGS. 3a–3c and 4a–4c) are also permissible. Similar to that described above, it is preferred that removal of the insulating layer 136 (and portions of the bump 130 if necessary such as with the abrasion method) should be such that a sufficient amount of the bump 130 is exposed for making a sufficient electrical contact (with the corresponding pad 125 of the circuit element 121), and that there remains a sufficient amount of the insulating layer for facilitating a sufficient mechanical connection (bond) when the circuit elements 120, 121 are joined or laminated together (FIGS. 5e and 5f).

Figure 5D:
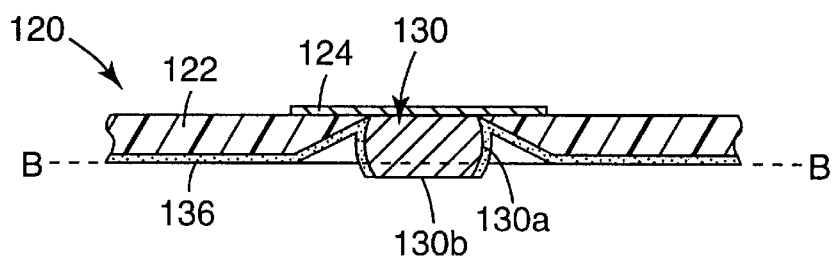

Upon completion of the abrasion step, the resultant circuit element 120, as shown in FIG. 5d, has bumps 130 with newly exposed surfaces 130b at or beyond, preferably beyond, plane B (away from the substrate 122). A sufficient amount of the insulating layer 136 remains for a mechanical connection of circuit elements 120, 121. Preferably, as described above, the insulating layer 136 remains substantially intact, having not been substantially affected by this removal step.

Figure 5E:
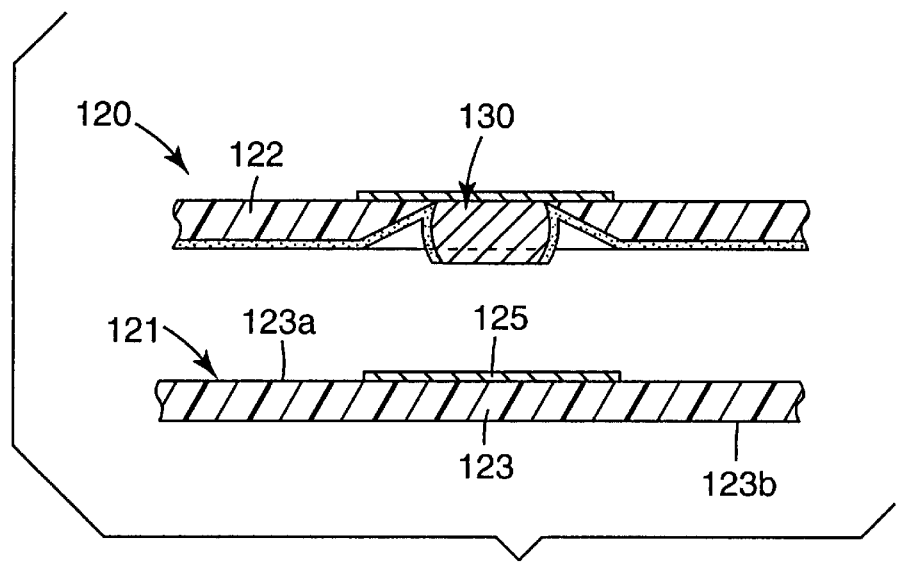
Figure 5F:
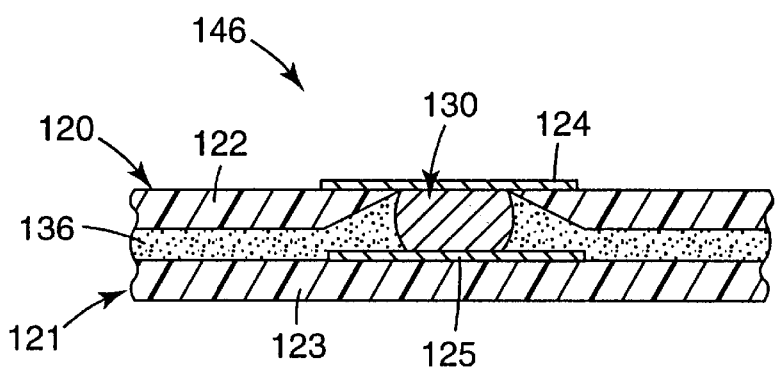

As shown in FIG. 5e, the now complete first circuit element 120 is aligned with the second circuit element 121, and these circuit elements 120, 121 are brought together. Specifically, the bumps 130 are aligned with their corresponding pads 125 on the second, now adjacent, circuit element 121. The alignment can be performed by any suitable conventional alignment technique, such as mechanical alignment using alignment pins, optical registration using fiducials and other methods known in the art.

The circuit elements 120, 121 are joined or laminated as pressure is applied to them, making simultaneous mechanical and electrical connections therebetween.

An optional heating step, e.g., to assist in flowing or curing the adhesive of the insulating layer 136 (if a flowable adhesive is used), may be done at any time during the lamination process, for as long as desired. The circuit elements 120, 121 are now bonded together into an intermediate circuit 146 (multi-layered circuit), as shown in FIG. 5f. The adhesive of the insulating layer 136 provides the mechanical strength to the intermediate circuit 146 and the exposed bumps 130 are in physical contact with their respective corresponding pads 125, creating the electrical connection.

EXAMPLE 1

Figure 6A:
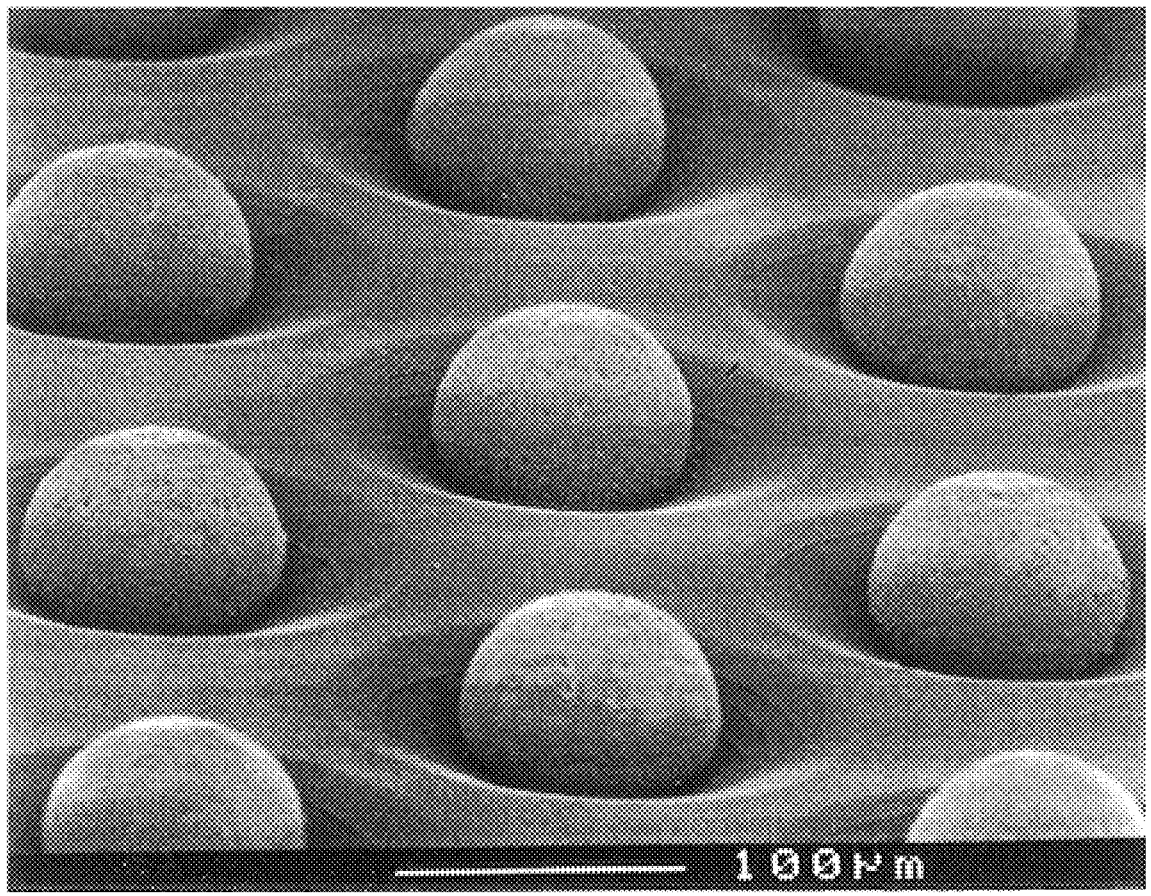
FIGS. 6a–6c are micrographs of circuit elements at various stages of processing in accordance with the present invention.

A patterned flexible circuit was made in accordance with FIGS. 5a–5f. The circuit elements included polyimide dielectric films with patterned copper traces on one side. At least one of the circuit elements included holes (vias) on the side opposite the patterned circuit traces. The patterned traces and holes were made by conventional methods. The vias were located at points where electrical connections were desired. Bumps of solder were created by deposition. The resultant bumps, as shown in the SEM micrograph at FIG. 6a, extended to a height of about 50 micrometers and protruded above the plane formed by the polyimide dielectric film surface.

Figure 6B:
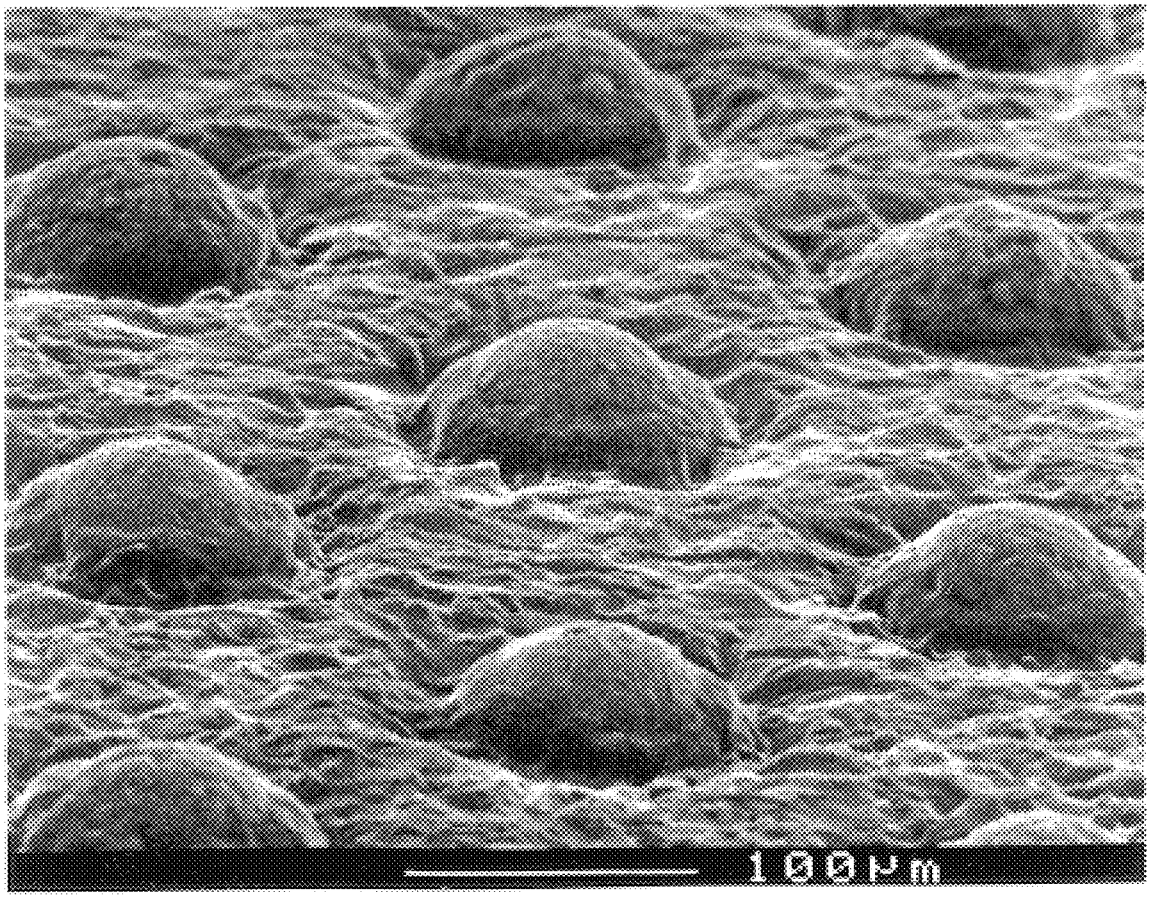
Figure 6C:
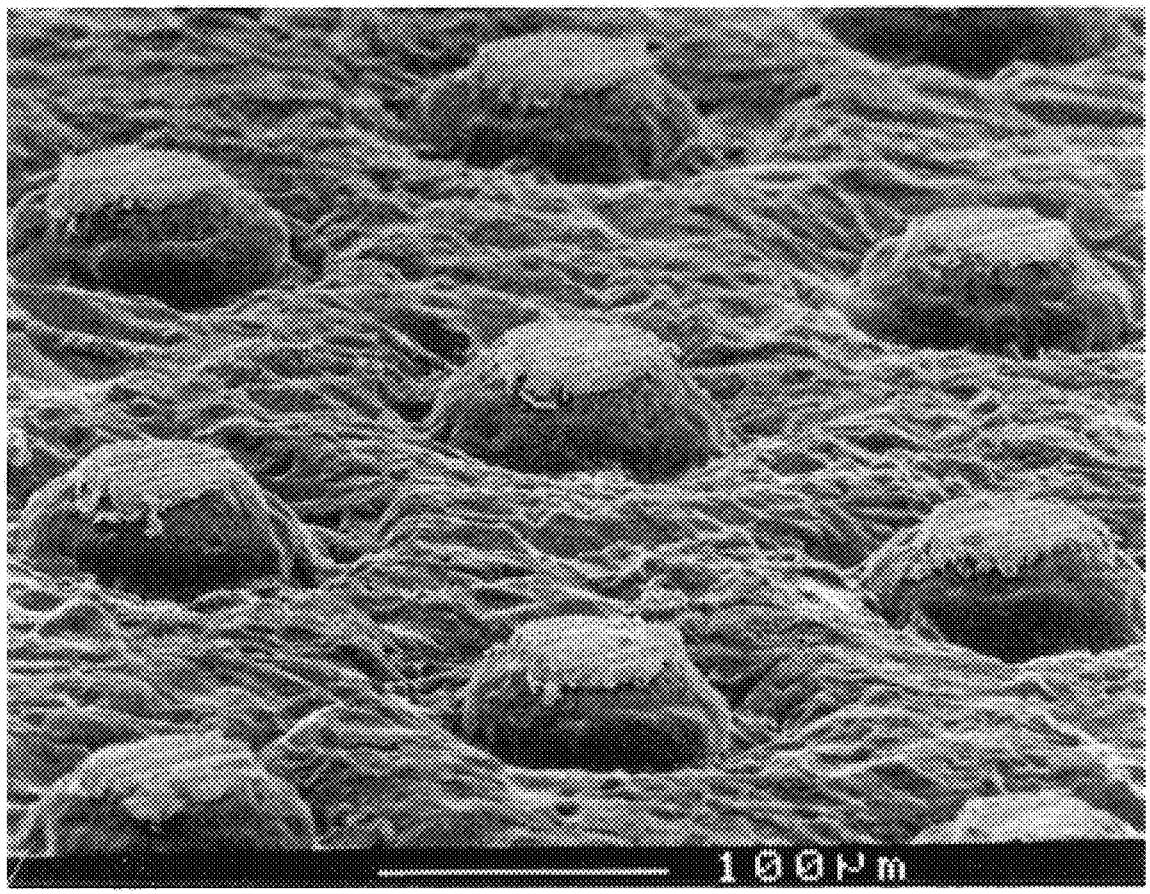

A layer of adhesive, available under the trade designation PYRALUX LF from E. I. DuPont de Nemours, Inc., Wilmington, Del., USA, was applied to the surface of the circuit element including the bumps with a hot roll laminator at 120° C., at a substantially uniform thickness of approximately 25 micrometers. The resultant circuit element is shown in an SEM micrograph at FIG. 6b. Abrasives were used separately to remove the adhesive from areas proximate the apexes of the bumps as described above. These abrasives included 600 grit sandpaper, available under the trade designation SCOTCHBRITE (5S-Fine), from 3M Co., St. Paul, Minn., USA, as well as microabrasives available under the trade designation Imperial Lapping Film from 3M Co., St. Paul, Minn., USA. The circuit with adhesive layer, removed by the 3M Imperial Lapping film microabrasive, is shown in the SEM micrograph of FIG. 6c.

Two circuit elements of the above disclosed dielectric films were stacked on top of each other using a metal plate mounted with pins for registration of the films, and the entire assembly was placed in a platen press and laminated at 170° C. at 450 psi ($3.2 \times 10^6$ N/m$^2$) for 30–90 minutes. The completed circuit interconnect assembly was removed from the press.

A control was made in the manner identical to the above sample, except that the abrasive steps were omitted, so as not to remove the adhesive layer from the apexes of the bumps.

Figure 7:
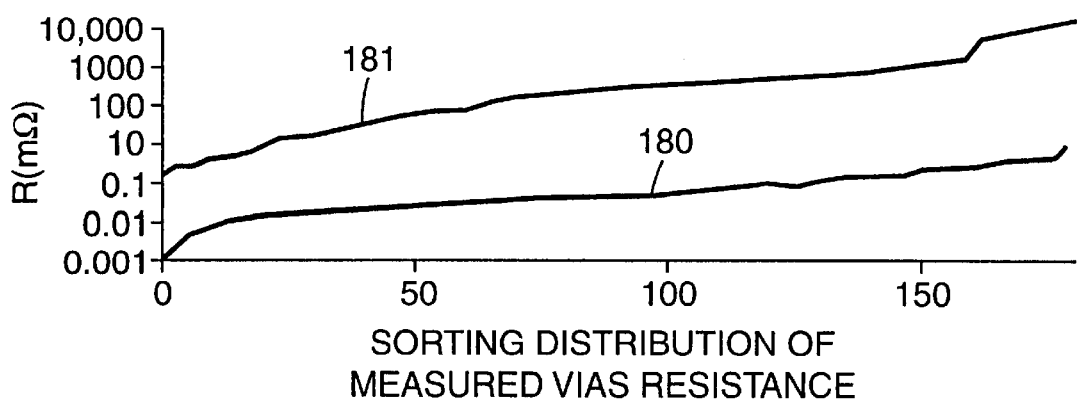
FIG. 7 is a chart of electrical resistance distribution between an unpolished control and a circuit element made in accordance with the present invention.

FIG. 7 shows a comparison of the electrical resistance distribution for 175 vias between the sample circuit element with abraded or "polished" bumps (the electrical resistance illustrated by line 180) and a control sample with 175 vias of unabraded or "unpolished" bumps (the electrical resistance illustrated by line 181).

Based on these results, a two order of magnitude difference in electrical resistance was observed.

While embodiments of the present invention have been described so as to enable one skilled in the art to practice the techniques of the present invention, the preceding description is intended to be exemplary. It should not be used to limit the scope of the invention, which should be determined by reference to the following claims.

What is claimed is:

1. A method for making an electronic circuit comprising:
   providing a first circuit element, said first circuit element made by steps including:
      providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;
      placing a conducting member onto said precursor circuit element into electrical communication with said first conductor, said conducting member including a surface and protruding to an apex at a first level, said first level at least beyond said first surface plane;
      said precursor element surface and said conducting member surface defining a major surface of a predetermined shape;
      placing a second insulating layer onto substantially all of said major surface, said second insulating layer including oppositely disposed portions extending laterally from said conducting member along said first surface of said first insulating layer, said second insulating layer at said oppositely disposed portions extending to a second level, said first level beyond said second level;
      removing at least a portion of said second insulating layer proximate said apex of said conducting member;
   providing a second circuit element with a second conductor;
   aligning said first circuit element with said second circuit element; and
   applying pressure to said first and second circuit elements, to join said circuit elements, such that said conducting member provides electrical conduction between said first conductor and said second conductor;
   wherein said precursor circuit element and said second circuit element each include at least one dielectric film.

2. The method of claim 1, wherein said first insulating layer includes said at least one dielectric film.

3. A method for making an electronic circuit comprising:
   providing a first circuit element, said first circuit element made by steps including:
      providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;
      forming a via in said precursor element in said first insulating layer proximate said first conductor;
      placing a conducting member onto said precursor circuit element into electrical communication with said first conductor, said conducting member including a metal bump having a surface and protruding to an apex at a first level, said first level at least beyond said first surface plane;
      said precursor element surface and said conducting member surface defining a major surface of a predetermined shape;
      placing a second insulating layer onto substantially all of said major surface, said second insulating layer including oppositely disposed portions extending laterally from said conducting member along said first surface of said first insulating layer, said second insulating layer at said oppositely disposed portions extending to a second level, said first level beyond said second level;
      removing at least a portion of said second insulating layer proximate said apex of said conducting member;
   providing a second circuit element with a second conductor;
   aligning said first circuit element with said second circuit element; and
   applying pressure to said first and second circuit elements, to join said circuit elements, such that said conducting member provides electrical conduction between said first conductor and said second conductor.

4. A method for making an electronic circuit comprising:
   providing a first circuit element, said first circuit element made by steps including:
      providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

placing a conducting member onto said precursor circuit element into electrical communication with said first conductor, said conducting member including a surface and protruding to an apex at a first level, said first level at least beyond said first surface plane;

said precursor element surface and said conducting member surface defining a major surface of a predetermined shape;

placing a second insulating layer onto substantially all of said major surface, said second insulating layer including oppositely disposed portions extending laterally from said conducting member along said first surface of said first insulating layer, said second insulating layer at said oppositely disposed portions extending to a second level, said first level beyond said second level;

removing at least a portion of said second insulating layer proximate said apex of said conducting member;

providing a second circuit element with a second conductor;

aligning said first circuit element with said second circuit element;

applying pressure to said first and second circuit elements, to join said circuit elements, such that said conducting member provides electrical conduction between said first conductor and said second conductor; and heating said first and second circuit elements to slightly less than the melting temperature of said conducting member.

5. A method for making an electronic circuit comprising:
providing a first circuit element, said first circuit element made by steps including:
providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

placing a conducting member onto said precursor circuit element into electrical communication with said first conductor, said conducting member including a surface and protruding to an apex at a first level, said first level at least beyond said first surface plane;

said precursor element surface and said conducting member surface defining a major surface of a predetermined shape;

placing a second insulating layer onto substantially all of said major surface, said second insulating layer including oppositely disposed portions extending laterally from said conducting member along said first surface of said first insulating layer, said second insulating layer at said oppositely disposed portions extending to a second level, said first level beyond said second level;

removing at least a portion of said second insulating layer proximate said apex of said conducting member;

providing a second circuit element with a second conductor;

aligning said first circuit element with said second circuit element; and applying pressure to said first and second circuit elements, to join said circuit elements, such that said conducting member provides electrical conduction between said first conductor and said second conductor;

wherein said first conductor and said second conductor include copper.

6. A method for making an electronic circuit comprising:
providing a first circuit element, said first circuit element made by steps including:
providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

placing a conducting member onto said precursor circuit element into electrical communication with said first conductor, said conducting member including a surface and protruding to an apex at a first level, said first level at least beyond said first surface plane;

said precursor element surface and said conducting member surface defining a major surface of a predetermined shape;

placing a second insulating layer onto substantially all of said major surface in a substantially uniform thickness and in conformance with said predetermined shape of said major surface, said second insulating layer including oppositely disposed portions extending laterally from said conducting member along said first surface of said first insulating layer, said second insulating layer at said oppositely disposed portions extending to a second level, said first level beyond said second level, wherein said oppositely disposed portions of said second insulating layer include surfaces, at least a portion of each of said second insulating layer surfaces defining a second surface plane, and said removal additionally includes removing at least a portion of said second insulating layer beyond said second surface plane;

removing at least a portion of said second insulating layer proximate said apex of said conducting member by contacting said second insulating layer with an abrasive material;

providing a second circuit element with a second conductor;

aligning said first circuit element with said second circuit element; and applying pressure to said first and second circuit elements, to join said circuit elements, such that said conducting member provides electrical conduction between said first conductor and said second conductor.

7. The method of claim 6, wherein said abrasive material is a microabrasive.

8. A method for making an electronic circuit comprising:
providing a first circuit element, said first circuit element made by steps including:
providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

placing a conducting member onto said precursor circuit element into electrical communication with said first conductor, said conducting member including a surface and protruding to an apex at a first level, said first level at least beyond said first surface plane;

said precursor element surface and said conducting member surface defining a major surface of a predetermined shape;

placing a second insulating layer onto substantially all of said major surface in a substantially uniform thickness and in conformance with said predetermined shape of said major surface, said second insulating layer including oppositely disposed portions extending laterally from said conducting member along said first surface of said first insulating layer, said second insulating layer at said oppositely disposed portions extending to a second level, said first level beyond said second level, wherein said oppositely disposed portions of said second insulating layer include surfaces, at least a portion of each of said second insulating layer surfaces defining a second surface plane, and said removal additionally includes removing at least a portion of said second insulating layer beyond said second surface plane;

removing at least a portion of said second insulating layer proximate said apex of said conducting member by placing an article into contact with said second insulating layer proximate said apex, applying pressure to said pressure element, and releasing said pressure;

providing a second circuit element with a second conductor;

aligning said first circuit element with said second circuit element; and applying pressure to said first and second circuit elements, to join said circuit elements, such that said conducting member provides electrical conduction between said first conductor and said second conductor.

9. The method of claim 8, wherein said step of releasing said pressure includes removing said article from contact with said pressure element.

10. The method of claim 8, wherein said article has substantial affinity for the material of the second insulating layer, whereby releasing said pressure include separating said article from said precursor circuit element, wherein at least portions of the second insulating layer proximate said apex are removed and remain on said article.

11. The method of claim 8, additionally comprising etching said second insulating layer proximate said apex.

12. A method for making an electronic circuit element comprising:

providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

placing a conducting member onto the precursor circuit element into electrical communication with said first conductor, said conducting member including a surface and protruding to an apex at a first level, said first level at least beyond said first surface plane;

said precursor element surface and said conducting member surface defining a major surface of a predetermined shape;

placing a second insulating layer onto substantially all of said major surface, said second insulating layer including oppositely disposed portions extending laterally from said conducting member along said first surface of said first insulating layer, said second insulating layer at said oppositely disposed portions extending to a second level, said first level beyond said second level; and removing at least a portion of said second insulating layer proximate the apex of said conducting member;

wherein said precursor circuit element and said second circuit element each include at least one dielectric film.

13. The method of claim 12, wherein said first insulating layer includes said at least one dielectric film.

14. A method for making an electronic circuit element comprising:

providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

forming a via in said precursor element in said first insulating layer proximate said first conductor;

placing a conducting member onto the precursor circuit element into electrical communication with said first conductor, said conducting member including a metal bump having a surface and protruding to an apex at a first level, said first level at least beyond said first surface plane;

said precursor element surface and said conducting member surface defining a major surface of a predetermined shape;

placing a second insulating layer onto substantially all of said major surface, said second insulating layer including oppositely disposed portions extending laterally from said conducting member along said first surface of said first insulating layer, said second insulating layer at said oppositely disposed portions extending to a second level, said first level beyond said second level; and removing at least a portion of said second insulating layer proximate the apex of said conducting member.

15. A method for making an electronic circuit element comprising:

providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

placing a conducting member onto the precursor circuit element into electrical communication with said first conductor, said conducting member including a surface and protruding to an apex at a first level, said first level at least beyond said first surface plane;

said precursor element surface and said conducting member surface defining a major surface of a predetermined shape;

placing a second insulating layer onto substantially all of said major surface in a substantially uniform thickness and in conformance with said predetermined shape of said major surface, said second insulating layer including oppositely disposed portions extending laterally from said conducting member along said first surface of said first insulating layer, said second insulating layer at said oppositely disposed portions extending to a second level, said first level beyond said second level, wherein said oppositely disposed portions of said second insulating layer include surfaces, at least a portion of each of said second insulating layer surfaces defining a second surface plane, and said removal additionally includes removing at least a portion of said second insulating layer beyond said second surface plane; and removing at least a portion of said second insulating layer proximate the apex of said conducting member by contacting said second insulating layer with an abrasive material.

16. The method of claim 15, wherein said abrasive material includes a microabrasive.

17. A method for making an electronic circuit element comprising:

providing a precursor element including a first insulating layer and a first conductor attached to said first insulating layer, said first insulating layer having a first surface, at least a portion of said first surface defining a first surface plane and said precursor element having a surface, said precursor element surface including said first surface of said insulating layer;

placing a conducting member onto the precursor circuit element into electrical communication with said first conductor, said conducting member including a surface and protruding to an apex at a first level, said first level at least beyond said first surface plane;

said precursor element surface and said conducting member surface defining a major surface of a predetermined shape;

placing a second insulating layer onto substantially all of said major surface in a substantially uniform thickness and in conformance with said predetermined shape of said major surface, said second insulating layer including oppositely disposed portions extending laterally from said conducting member along said first surface of said first insulating layer, said second insulating layer at said oppositely disposed portions extending to a second level, said first level beyond said second level, wherein said oppositely disposed portions of said second insulating layer include surfaces, at least a portion of each of said second insulating layer surfaces defining a second surface plane, and said removal additionally includes removing at least a portion of said second insulating layer beyond said second surface plane; and removing at least a portion of said second insulating layer proximate the apex of said conducting member by placing an article into contact with said second insulating layer proximate said apex, applying pressure to said precursor element, and releasing said pressure.

18. The method of claim 17, wherein said step of releasing said pressure includes removing said article from contact with said precursor circuit element.

19. The method of claim 17, wherein said article has substantial affinity for the material of the second insulating layer, whereby upon separation of said article from said precursor circuit element, at least a portion of the second insulating layer proximate said apex is removed.

20. The method of claim 15, additionally comprising etching said second insulating layer proximate said apex.

* * * * *